(12) United States Patent
Uetani et al.

(10) Patent No.: US 6,383,708 B1
(45) Date of Patent: May 7, 2002

(54) POSITIVE RESIST COMPOSITION

(75) Inventors: Yasunori Uetani; Yasunori Doi; Kazuhiko Hashimoto; Haruyoshi Osaki; Ryotaro Hanawa, all of Osaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 08/160,290

(22) Filed: Dec. 2, 1993

Related U.S. Application Data

(63) Continuation of application No. 07/873,119, filed on Apr. 24, 1992, now abandoned.

(30) Foreign Application Priority Data

Apr. 26, 1991 (JP) ............................................. 3-097263
Nov. 29, 1991 (JP) ............................................. 3-316500

(51) Int. Cl.$^7$ ................................................ G03C 1/52
(52) U.S. Cl. ........................ 430/191; 430/192; 430/193
(58) Field of Search ................................ 430/191, 192, 430/193

(56) References Cited

U.S. PATENT DOCUMENTS

| | | | |
|---|---|---|---|
| 3,699,135 A | | 10/1972 | Baptista et al. |
| 3,902,906 A | * | 9/1975 | Iwama et al. ................ 430/191 |
| 4,526,856 A | | 7/1985 | Lewis et al. ................ 430/191 |
| 4,575,480 A | | 3/1986 | Kotani et al. ................ 430/192 |
| 4,732,840 A | * | 3/1988 | Hasegawa .................... 430/192 |
| 4,845,008 A | | 7/1989 | Nishioka et al. ............. 430/165 |
| 4,871,645 A | | 10/1989 | Uenishi et al. ............. 430/192 |
| 4,927,732 A | * | 5/1990 | Merrem et al. ............. 430/191 |
| 5,059,507 A | * | 10/1991 | Uetani et al. ................ 430/192 |
| 5,077,173 A | * | 12/1991 | Schulz et al. ................ 430/191 |
| 5,246,818 A | * | 9/1993 | Lin ............................. 430/191 |
| 5,254,432 A | * | 10/1993 | Aoai ........................... 430/192 |
| 5,279,918 A | * | 1/1994 | Nishi et al. ................. 430/191 |

FOREIGN PATENT DOCUMENTS

| | | |
|---|---|---|
| DE | 370542 | 8/1987 |
| EP | 0273026 | 6/1988 |
| EP | 0341608 | 11/1989 |
| EP | 0346808 | 12/1989 |
| JP | 6024545 | 7/1985 |
| JP | 61118744 | 6/1986 |

* cited by examiner

*Primary Examiner*—Christopher G. Young
(74) *Attorney, Agent, or Firm*—Birch, Stewart, Kolasch & Birch, LLP

(57) ABSTRACT

A positive resist composition comprising, in admixture, an alkali-soluble resin, a quinone diazide compound and a mixed solvent of (B) at least one organic solvent selected from the group consisting of γ-butyrolactone, 3-methoxybutanol and cyclohexanone and (A) an organic solvent other than the solvents (B) which does not have simultaneously an alkylcarbonyl group and an alkoxy group in a molecule and has a boiling point of from 140 to 180° C. under atmospheric pressure (B), which composition has a large γ-value and provides an improved profile and a large depth of focus.

5 Claims, No Drawings

POSITIVE RESIST COMPOSITION

This application is a continuation of application Ser. No. 07/873,119 filed Apr. 24, 1992, now abandoned.

BACKGROUND OF THE INVENTION

Field of the Invention

The present invention relates to a positive resist composition which comprises a quinone diazide compound, an alkali-soluble resin and a specific solvent system. 2. Description of the Related Art A composition containing a compound having a quinone diazide group (a quinone diazide compound) and an alkali-soluble resin finds use as a positive resist in the production of integrated circuits.

Recently, with integrated circuits, miniaturization has proceeded with a rise in the integration level, which results in demands for formation of patterns of sub-micron order. To form such minute patterns with good reproducibility, the positive resist composition should achieve high resolution, a large γ-value and a good profile and also have high qualities in various process margins such as an exposure margin and a depth of focus.

Since the width of wiring is miniaturized with the increase of the integration level, dry etching is employed in addition to wet etching. For dry etching, the resist is required to have higher resistance to dry etching, namely heat resistance than ever.

In these years, instead of a conventional mask contact printing method, a reduction projection exposure system attracts attention. One of the serious problems in this new system is low throughput. Namely, in this system, the total exposure time to expose a wafer is very long because of divided and repeated light exposure unlike a batch light exposure system which is employed in the conventional mask contact printing methods.

To solve this problem, an increase in sensitivity of the resist is most-important. If the exposure time can be shortened by an increase in the sensitivity, the throughput and in turn a yield can be improved.

One measure to increase the sensitivity is a decrease of the molecular weight of an alkali-soluble resin contained in the resist composition. However, the decrease of the molecular weight encounters some problems, for example, a large film thickness loss in an unexposed area (reduction of so-called film thickness retention), a worsening of a profile and various process margins, and a decrease of the γ-value because of a small difference in the dissolving rates in the developing solution between the exposed area and the unexposed area. In addition, the heat resistance of the resist is deteriorated and adhesion of the resist to a substrate is decreased disadvantageously.

Other measures to increase the sensitivity include prolongation of the developing time and increase of the concentration of an alkali in the developing liquid. However, they are not preferable since the film thickness retention and in turn the resolution are decreased.

To increase the γ-value, it is contemplated to increase the amount of the quinone diazide compound. But, the increase of the amount of the quinone diazide compound may lead to precipitation of fine particles of the quinone diazide compound and the alkali-soluble resin and therefore a decrease in the yield of the integrated circuits.

To solve such problems, it may be possible to use a monohydroxycarboxylate ester such as ethyl lactate which has a large dissolving capability for the quinone diazide compound and is safer with respect to human beings than the conventional resist solvent such as ethyleneglycol monoalkyl ether acetate. However, such a solvent will increase striations or cause some problem in coating such that the edge of a wafer is not coated.

SUMMARY OF THE INVENTION

An object of the present invention is to provide a positive resist composition which has a large γ-value and provides a good profile and a large depth of focus while maintaining other properties required for a resist such as good heat resistance, high resolution, good sensitivity and a good coating property.

According to the present invention, there is provided a positive resist composition comprising, in admixture, an alkali-soluble resin, a quinone diazide compound and a mixed solvent of (B) at least one organic solvent selected from the group consisting of γ-butyrolactone, 3-methoxybutanol and cyclohexanone and (A) an organic solvent other than the solvents (B) which does not have simultaneously an alkylcarbonyl group and an alkoxy group in a molecule and has a boiling point of from 140 to 180° C. under atmospheric pressure.

DETAILED DESCRIPTION OF THE INVENTION

In the positive resist composition of the present invention, a quinone diazide compound may be any one of conventionally used compounds. For example, a quinone diazide compound is an ester of a below described hydroxyl group-containing compound with a quinone diazide sulfonic acid such as 1,2-benzoquinone diazide-4-sulfonic acid, 1,2-naphthoquinone diazide-4-sulfonic acid or 1,2-naphthoquinone diazide-5-sulfonic acid. Preferably, a quinone diazide compound is an ester of a hydroxyl group-containing compound of the formula:

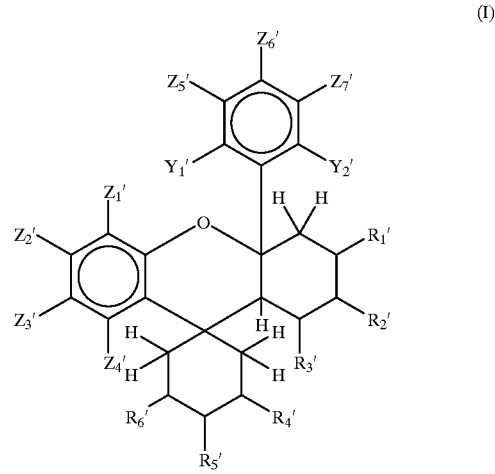

(I)

wherein $Y_1'$, $Y_2'$, $Z_1'$, $Z_2'$, $Z_3'$, $Z_4'$, $Z_5'$, $Z_6'$ and $Z_7'$ are the same and different and each a hydrogen atom, a hydroxyl group or a $C_1$–$C_4$ alkyl group provided that at least one of $Y_1'$ and $Y_2'$ is a hydroxyl group and at least two of $Z_1'$, $Z_2'$, $Z_3'$, $Z_4'$, $Z_5'$, $Z_6'$ and $Z_7'$ are hydroxyl groups; and $R_1'$, $R_2'$, $R_3'$, $R_4'$, $R_5'$ and $R_6'$ are the same or different and each a hydrogen atom, a $C_1$–$C_{10}$ alkyl group, a $C_2$–$C_4$ alkenyl group, a $C_5$–$C_8$ cycloalkyl group or an aryl group, or an oxyflavan compound of the formula:

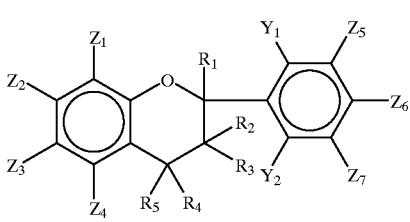

(II)

wherein $Y_1$ and $Y_2$ are the same or different and each a hydrogen atom, a hydroxyl group or a $C_1$–$C_4$ alkyl group provided that at least one of them is a hydroxyl group; $Z_1$, $Z_2$, $Z_3$, $Z_4$, $Z_5$, $Z_6$ and $Z_7$ are the same or different and each a hydrogen atom, a halogen atom, a hydroxyl group, a $C_1$–$C_4$ alkyl group, a $C_5$–$C_8$ cycloalkyl group or an aryl group provided that at least two of them are hydroxyl groups; and $R_1$, $R_2$, $R_3$, $R_4$ and $R_5$ are the same or different and each a hydrogen atom, a $C_1$–$C_{10}$ alkyl group, a $C_2$–$C_4$ alkenyl group, a cyclohexyl group or an aryl group provided that at least one of $R_4$ and $R_5$ is a $C_1$–$C_{10}$ alkyl group, a $C_2$–$C_4$ alkenyl group, a cyclohexyl group or an aryl group with the above quinone diazide sulfonic acid.

Among them, the quinone diazide sulfonic acid ester of the oxyflavan (II) is preferred.

The quinone diazide compound may be prepared by a per se conventional method. For example, the quinone diazide sulfonic acid and the hydroxyl group-containing compound are condensed in the presence of a weak alkali.

Examples of the hydroxyl group-containing compound are hydroquinone, resorcinol, phloroglucin, 2,4-dihydroxybenzophenone, trihydroxybenzophenones (e.g. 2,3,4-trihydroxybenzophenone, 2,2',3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2,3',4-trihydroxybenzophenone, 2,3',5-trihydroxybenzophenone, 2,4,4'-trihydroxybenzophenone, 2,4',5-trihydroxybenzophenone, 2',3,4-trihydroxybenzophenone, 3,3',4-trihydroxybenzophenone, 3,4,4'-trihydroxybenzophenone, etc.), tetrahydroxybenzophenones (e.g. 2,3,3',4'-tetrahydroxybenzophenone, 2,3,4,4'-tetrahydroxybenzophenone, 2,2',4,4'-tetrahydroxybenzophenone, 2,2',3,4-tetrahydroxybenzophenone, 2,2',3,4'-tetrahydroxybenzophenone, 2,2',5,5'-tetrahydroxybenzophenone, 2,3',4',5-tetrahydroxybenzophenone, 2,3',5,5'-tetrahydroxybenzophenone, etc.), pentahydroxybenzophenones (e.g. 2,2',3,4,4'-pentahydroxybenzophenone, 2,2',3,4,5'-pentahydroxybenzophenone, 2,2',3,3',4-pentahydroxybenzophenone, 2,3,3',4,5'-pentahydroxybenzophenone, etc.), hexahydroxybenzophenones (e.g. 2,3,3',4,4',5-hexahydroxybenzophenone, 2,2',3,3',4,5'-hexahydroxybenzophenone, etc.), alkyl gallates, the compound of the formula (I), a compound which is disclosed in Japanese Patent Kokai Publication No. 269351/1990 corresponding U.S. patent application Ser. No. 07/347,065 and EP-A-0 341 608, and represented by the formula:

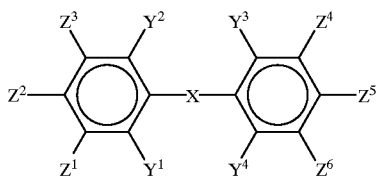

(III)

wherein $Y^1$, $Y^2$, $Y^3$ and $Y^4$ are the same or different and each a hydrogen atom, a halogen atom, an alkyl group or a hydroxyl group provided that at least one of them is a hydroxyl group; $Z^1$, $Z^2$, $Z^3$, $Z^4$, $Z^5$ and $Z^6$ are the same or different and each a hydrogen atom, a halogen atom, an alkyl group, an aryl group or a hydroxyl group provided that at least one of them is a hydroxyl group; and X is a group of the formula: —C($R^1$)($R^2$)— in which $R^1$ and $R^2$ are the same or different and each a hydrogen atom, an alkyl group, an alkenyl group, a cycloalkyl group, an alkoxyl group or an aryl group provided that when at least one of them is a hydrogen atom, an alkyl or aryl group is present at an ortho-position to a hydroxyl group which is present at an ortho-position to the group X.

As the alkali-soluble resin, polyvinylphenol, a novolak resin and the like are exemplified.

The novolak resin is prepared by a condensation reaction of a phenol with an aldehyde. Specific examples of the phenol used as one of the raw materials for the novolak resin include phenol, o-, m- or p-cresol, 2,5-, 3,5- or 3,4-xylenol, 2,3,5-trimethylphenol, 4-, 2- or 3-tert.-butylphenol, 3-, 2- or 4-ethylphenol, 3-methyl-6-tert.-butylphenol, 4-methyl-2-tert.-butylphenol, 2-naphthol, 1,3-, 1,7- or 1,5-dihydroxynaphthalene, and the like. These phenols may be used alone or in combination.

Examples of the aldehyde are aliphatic aldehydes (e.g. formaldehyde, acetaldehyde, etc.), aromatic aldehydes (e.g. benzaldehyde, o-, m- or p-hydroxybenzaldehyde, o- or p-methylbenzaldehyde, etc.) and the like.

A weight ratio of the quinone diazide compound to the alkali-soluble resin is preferably from 1:1 to 1:7.

Specific examples of the organic solvent (A) are cyclohexanol, diacetonealcohol, butylcellosolve, cyclohexanone, methyldiacetonealcohol, 2-heptanone, anisol, n-amyl acetate, n-butyl acetate, diisopropyl ketone, 2-octanone, 3-octanone and the like. They may be used independently or as a mixture of two or more of them. Among them, n-amyl acetate, 2-heptanone, anisol, 2-octanone and 3-octanone are preferred, n-amyl acetate and 2-heptanone are more preferred, and n-heptanone are most preferred.

A weight ratio of the organic solvent (A) and the organic solvent (B) is preferably from 98:2 to 30:70, more preferably from 95:5 to 40:60.

When a ratio of the organic solvent (B) is too small, the γ-value is decreased and the profile is worsened. When the ratio of the organic solvent (B) is too large, the coating property is deteriorated.

The solvent mixture to be used in the present invention is used in an amount that a coating film is uniformly formed on the wafer and no pin hole or no irregular coating is found. Preferably, the solvent system is used in an amount that a total amount of the quinone diazide compound and the alkali-soluble resin is from 3 to 50% by weight based on the whole weight of the resist composition.

Insofar as the effect of the present invention is not deteriorated, the resist composition of the present invention may contain another solvent such as toluene, xylene, methyl isobutyl ketone, methyl ethyl ketone, acetone, propyleneglycol monoethyl ether acetate, propyleneglycol monomethyl ether acetate, etc.

The positive resist composition is prepared by mixing and dissolving the quinone diazide compound and the alkali-soluble resin in the solvent system of the present invention.

The positive resist composition of the present invention may contain other conventionally used additives such as a sensitizer, other additional resin, a surfactant, a stabilizer or a dye which increases visibility of the formed figure and conventional additives.

The positive resist composition of the present invention has a large γ-value and is excellent in a profile and a depth of focus.

PREFERRED EMBODIMENTS OF THE INVENTION

The present invention will be illustrated more in detail by the following Examples, but it is not limited to these Examples. In the Examples, "parts" are by weight.

EXAMPLES 1 TO 16 AND COMPARATIVE EXAMPLES 1 to 5

A mixture of a novolak resin and a quinone diazide compound in amounts shown in the Table was dissolved in a solvent (45 parts). The resulting solution was filtered through a TEFLON (a trademark) filter of 0.2 μm in pore size. The resist solution,.was coated on a silicone wafer, which had been rinsed in a usual way, by means of a spinner so as to form a resist film of 1.3 μm in thickness. Subsequently, the silicon wafer was baked for 60 seconds on a hot plate kept at 100° C., and exposed to light having a wavelength of 365 nm (i line) while varying the exposure time stepwise by means of a reduction projection exposing apparatus (LD-5010i with NA of 0.40 manufactured by Hitachi). Thereafter, the silicon wafer was baked (post exposure baking) on a hot plate kept at 110° C. for 60 second and developed for one minute in a developing solution (SOPD manufactured by Sumitomo Chemical Co., Ltd.) to obtain a positive pattern.

A resolution is evaluated by measuring a minimum size of a line-and-space pattern at which the pattern is separated without film thickness decrease at an exposure amount at which a line/space ratio (L/S) is 1:1 in the line-and-space pattern of 0.8 μm, with a scanning electron microscope.

A profile in the Table is a cross sectional shape of the 0.8 μm line-and-space pattern at the above exposure amount.

A γ-value is expressed in terms of tanθ the angle θ of which is obtained by plotting a standardized film thickness (=the retained film thickness/the original film thickness) against a logarithm of the exposure amount and calculating the inclination of the plotted line. A sensitivity (Eth) is an exposure amount at which the standardized film thickness is zero.

Heat resistance of the resist is expressed in terms of the maximum temperature at which a 3 μm line-and-space pattern is not deformed when the wafer having the pattern is heated on a hot plate for 3 minutes. The deformation of the pattern is observed with a scanning electron microscope.

A depth of focus is defined by measuring a width of focus values with which a 0.6 μm line-and-space pattern is separated at an exposure amount that the line/space ratio is 1:1 without causing the film thickness decrease and forming an extreme reverse tapered profile.

The results are shown in the Table.

TABLE

| Example No. | Composition | | | Resolution (μm) | Eth (msec.) | γ-Value | Heat resistance (° C.) | Profile | Depth of focus (μm) |
| --- | --- | --- | --- | --- | --- | --- | --- | --- | --- |
| | Novolak[*1)] resin | Quinone diazide compound[*2)] | Solvent | | | | | | |
| 1 | 15 parts | 3 parts | n-Amyl acetate (95%) γ-Butyrolactone (5%) | 0.50 | 250 | 2.9 | 130 |  | 3.0 |
| 2 | ↑ | ↑ | n-Amyl acetate (80%) γ-Butyrolactone (20%) | 0.50 | 250 | 4.7 | 130 |  | 3.0 |
| 3 | ↑ | ↑ | n-Amyl acetate (50%) γ-Butyrolactone (50%) | 0.50 | 230 | 4.6 | 130 |  | 3.0 |
| 4 | ↑ | ↑ | n-Amyl acetate (40%) γ-Butyrolactone (60%) | 0.50 | 230 | 3.6 | 130 |  | 3.0 |
| 5 | 15 parts | 3 parts | 2-Heptanone (90%) γ-Butyrolactone (10%) | 0.50 | 250 | 4.5 | 130 |  | 3.5 |
| 6 | ↑ | ↑ | 2-Heptanone (60%) γ-Butyrolactone (40%) | 0.50 | 230 | 4.2 | 130 |  | 3.5 |

TABLE-continued

| Example No. | Composition Novolak*1) resin | Quinone diazide compound*2) | Solvent | Resolution (μm) | Eth (msec.) | γ-Value | Heat resistance (° C.) | Profile | Depth of focus (μm) |
|---|---|---|---|---|---|---|---|---|---|
| 7 | ↑ | ↑ | 2-Heptanone (40%) γ-Butyrolactone (60%) | 0.50 | 230 | 5.2 | 130 |  | 3.5 |
| 8 | 15 parts | 3 parts | 2-Heptanone (95%) 3-Methoxybutanol (5%) | 0.50 | 280 | 4.8 | 130 |  | 3.0 |
| 9 | ↑ | ↑ | 2-Heptanone (50%) 3-Methoxybutanol (50%) | 0.50 | 250 | 5.1 | 130 |  | 3.0 |
| 10 | ↑ | ↑ | 2-Heptanone (95%) Cyclohexanone (5%) | 0.50 | 250 | 5.2 | 130 |  | 3.0 |
| 11 | ↑ | ↑ | 2-Heptanone (50%) Cyclohexanone (50%) | 0.50 | 210 | 5.2 | 130 |  | 3.0 |
| 12 | 15 parts | 3 parts | n-Amyl acetate (95%) 3-Methoxybutanol (5%) | 0.50 | 320 | 4.2 | 130 |  | 3.0 |
| 13 | ↑ | ↑ | n-Amyl acetate (95%) Cyclohexanone (5%) | 0.50 | 260 | 4.2 | 130 |  | 3.0 |
| 14 | 15 parts | 3 parts | 3-Octanone (95%) γ-Butyrolactone (5%) | 0.50 | 270 | 3.8 | 130 |  | 3.0 |
| 15 | ↑ | ↑ | 3-Octanone (60%) γ-Butyrolactone (40%) | 0.50 | 230 | 5.1 | 130 |  | 3.0 |
| 16 | ↑ | ↑ | 2-Octanone (95%) γ-Butyrolactone (5%) | 0.50 | 270 | 4.2 | 130 |  | 3.0 |
| Comp. 1 | 15 parts | 3 parts | n-Amyl acetate | 0.50 | 250 | 2.3 | 130 |  | 2.5 |
| Comp. 2 | ↑ | ↑ | 2-Heptanone | 0.50 | 250 | 2.1 | 130 |  | 2.5 |
| Comp. 3 | ↑ | ↑ | γ-Butyrolactone | | | Coating impossible | | | |
| Comp. 4 | ↑ | ↑ | Propyleneglycol monomethyl ether acetate | 0.60 | 240 | 3.2 | 110 |  | 0.5 |

TABLE-continued

| | Composition | | | | | | Heat | | |
|---|---|---|---|---|---|---|---|---|---|
| Example No. | Novolak[*1)] resin | Quinone diazide compound[*2)] | Solvent | Resolution (μm) | Eth (msec.) | γ-Value | resistance (° C.) | Profile | Depth of focus (μm) |
| Comp. 5 | ↑ | ↑ | Cyclohexanone | 0.60 | 240 | 3.0 | 110 | 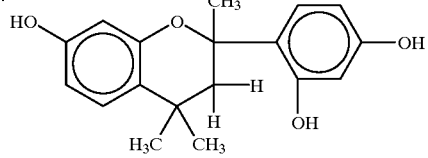 | 0.5 |

Note:
[*1)]Novolak resin: A cresol mixture (a molar ratio of m-isomer to p- isomer = 4:6) was reacted with formalin (a molar ratio of formalin to the cresol = 0.8:1) using oxalic acid as a catalyst to obtain a novolak resin having a weight average molecular weight of 6000 (calculated as polystyrene).
[*2)]A condensation product of naphthoquinone-(1,2)-diazide-(2)-5-sulfonic chloride with the compound of the formula (a molar ratio of 2.7:1):

What is claimed is:

1. A positive resist composition comprising, in admixture, an alkali-soluble novolak resin, an ester of a hydroxyl group containing compound with a quinone diazide sulfonic acid, and a mixed solvent consisting essentially of:
    (B) at least one organic solvent selected from the group consisting of γ-butyrolactone and 3-methoxybutanol; and
    (A) 2-haptanone,
    wherein a weight ratio of said organic solvent (A) to said organic solvent (B) is from 95:5 to 40:60.

2. The positive resist composition according to claim 1, wherein the weight ratio of the ester of a hydroxyl group containing compound with a quinone diazide sulfonic acid to the alkali-soluble novolak resin is 1:1 to 1:7.

3. The positive resist composition according to claim 1, wherein said solvent (B) is γ-butyrolactone.

4. The positive resist composition according to claim 1, wherein said solvent (B) is 3-methoxybutanol.

5. A positive resist composition comprising, in admixture, an alkali-soluble novolak resin, an ester of a hydroxyl group containing compound with a quinone diazide sulfonic acid and a mixed solvent of:
    (B) at least one organic solvent selected from the group consisting of γ-butyrolactone and 3-methoxybutanol; and
    (A) 2-heptanone,
    wherein a weight ratio of said organic solvent (A) to said organic solvent (B) is from 95:5 to 40:60, and wherein said hydroxyl group containing compound is an oxyflavan compound of the formula:

(II)

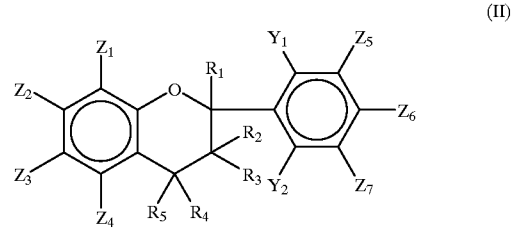

wherein $Y_1$ and $Y_2$ are the same or different and each is a hydrogen atom, a hydroxyl group or a $C_1$–$C_4$ alky group provided that at least one of $Y_1$ and $Y_2$ is a hydroxyl group; $Z_1$, $Z_2$, $Z_3$, $Z_4$, $Z_5$, $Z_6$ and $Z_7$ are the same or different and each is a hydrogen atom, a halogen atom, a hydroxyl group, a $C_1$–$C_4$ alkyl group, a $C_5$–$C_8$ cycloalkyl group or an aryl group provided that at least two of $Z_1$, $Z_2$, $Z_3$, $Z_4$, $Z_5$, $Z_6$ and $Z_7$ are hydroxyl groups; and $R_1$, $R_2$, $R_3$, $R_4$ and $R_5$ are the same or different and each is a hydrogen atom, a $C_1$–$C_{10}$ alkyl group, a $C_2$–$C_4$ alkenyl group, a cyclohexyl group or an aryl group provided that at least one of $R_4$ and $R_5$ is a $C_1$–$C_{10}$ alkyl group, a $C_2$–$C_4$ alkenyl group, a cyclohexyl group or an aryl group.

* * * * *

UNITED STATES PATENT AND TRADEMARK OFFICE
CERTIFICATE OF CORRECTION

PATENT NO. : 6,383,708 B1
DATED : May 7, 2002
INVENTOR(S) : Yasunori Uetani et al.

It is certified that error appears in the above-identified patent and that said Letters Patent is hereby corrected as shown below:

<u>Title page,</u>
Item [*], Notice, please insert the following paragraph:

-- This patent issued on a continuation prosecution application filed under 37 C.F.R. 1.53(d), and is subject to the twenty year patent term provisions of 35 U.S.C. 154(a)(2). -- before it reads "Subject to any disclaimer, the term of this patent is extended or adjusted under 35 U.S.C. 154(b) by 0 days.".

Signed and Sealed this

Tenth Day of June, 2003

JAMES E. ROGAN
*Director of the United States Patent and Trademark Office*